United States Patent
Wu et al.

(10) Patent No.: US 12,336,180 B2
(45) Date of Patent: Jun. 17, 2025

(54) MEMORY CELL ARRAY WITH INCREASED SOURCE BIAS VOLTAGE

(71) Applicant: Taiwan Semiconductor Manufacturing Company, Ltd., Hsinchu (TW)

(72) Inventors: Chen-Jun Wu, Hsinchu (TW); Sun Yi Chang, New Taipei (TW); Sheng-Chih Lai, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 13 days.

(21) Appl. No.: 17/818,343

(22) Filed: Aug. 8, 2022

(65) Prior Publication Data

US 2024/0049470 A1 Feb. 8, 2024

(51) Int. Cl.

| G11C 16/04 | (2006.01) |
|---|---|
| G11C 11/16 | (2006.01) |
| G11C 11/22 | (2006.01) |
| G11C 13/00 | (2006.01) |
| G11C 16/08 | (2006.01) |
| H10B 41/30 | (2023.01) |
| H10B 43/30 | (2023.01) |
| H10B 51/30 | (2023.01) |
| H10B 61/00 | (2023.01) |
| H10B 63/00 | (2023.01) |

(52) U.S. Cl.
CPC .......... *H10B 43/30* (2023.02); *G11C 11/1657* (2013.01); *G11C 11/2257* (2013.01); *G11C 13/0028* (2013.01); *G11C 16/08* (2013.01); *H10B 41/30* (2023.02); *H10B 51/30* (2023.02); *H10B 61/22* (2023.02); *H10B 63/30* (2023.02)

(58) Field of Classification Search
CPC ............ G11C 11/1657; G11C 11/2257; G11C 11/0028; G11C 16/08; H10B 43/30
See application file for complete search history.

(56) References Cited

U.S. PATENT DOCUMENTS

| 9,361,995 B1* | 6/2016 | Tran ........................ H10B 41/30 |
| 2007/0012988 A1* | 1/2007 | Bhattacharyya ....... H10B 69/00 257/314 |
| 2009/0091972 A1* | 4/2009 | Fukuda ............... G11C 11/4076 365/174 |

(Continued)

OTHER PUBLICATIONS

The second Office Action received in the counterprt Taiwan application 112105572, mailed on Sep. 20, 2024.

*Primary Examiner* — Min Huang
(74) *Attorney, Agent, or Firm* — KILPATRICK TOWNSEND & STOCKTON LLP

(57) ABSTRACT

A memory cell array is provided. The memory cell array includes: a plurality of memory cells arranged in a plurality of rows and a plurality of columns; a plurality of word lines electrically connected to the plurality of rows, respectively; a plurality of source lines electrically connected to the plurality of columns, respectively; and a plurality of bit lines electrically connected to the plurality of columns, respectively. A plurality of inactivated word lines are configured to be applied a bias voltage that is zero, and the plurality of source lines are configured to be applied a positive bias voltage.

20 Claims, 11 Drawing Sheets

(56) References Cited

U.S. PATENT DOCUMENTS

| | | | |
|---|---|---|---|
| 2009/0147580 A1* | 6/2009 | Lee | H10B 12/00 |
| | | | 257/E27.084 |
| 2013/0215683 A1 | 8/2013 | Lee et al. | |
| 2018/0082745 A1* | 3/2018 | Hisamoto | G11C 16/26 |
| 2022/0067499 A1* | 3/2022 | Tran | G06N 3/065 |
| 2022/0215870 A1* | 7/2022 | Jung | G11C 11/2259 |

* cited by examiner

MEMORY CELL ARRAY WITH INCREASED SOURCE BIAS VOLTAGE

FIELD

Embodiments of the present disclosure relate generally to memory devices, and more particularly to memory cell arrays with increased source bias voltage.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
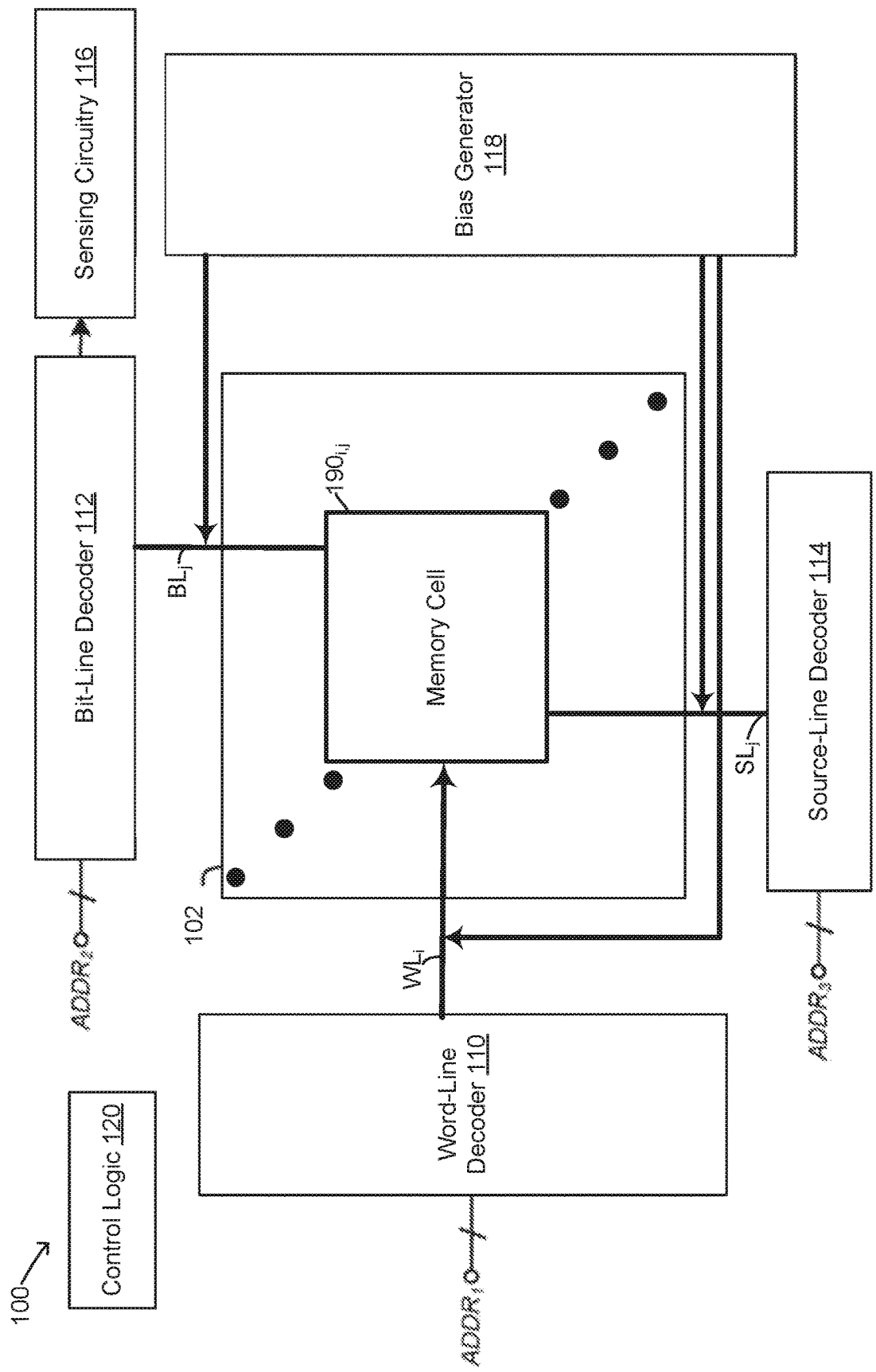
FIG. 1 is a diagram illustrating an example memory device system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Non-volatile memory (NVM) or non-volatile storage is a type of computer memory that can retain stored information even after the power supply is removed. In contrast, volatile memory needs constant power in order to retain data. Non-volatile memory is typically used for the task of secondary storage or long-term persistent storage.

Non-volatile memory includes, among other types, flash memory devices, ferroelectric random-access memory (FeRAM or FRAM) devices, magnetoresistive random-access memory (MRAM) devices, phase-change memory (PCRAM or PCM), resistive random-access memory (RRAM or ReRAM).

Flash memory is one kind of non-volatile memory. Flash memory is a solid-state memory device that maintains stored data without any external power source. Flash memory devices use two different technologies, namely NOR and NAND (named for the NOR and NAND logic gates), to map data. Both use the same cell design, consisting of floating gate metal-oxide-semiconductor field-effect transistors (MOSFETs). They differ at the circuit level depending on whether the state of the bit line or word lines is pulled high or low: in NAND flash, the relationship between the bit line and the word lines resembles a NAND gate; in NOR flash, it resembles a NOR gate.

NOR flash memory devices provide high-speed random access, reading and writing data in specific memory locations; they can retrieve as little as a single byte. NAND flash memory devices read and write sequentially at high speed, handling data in blocks. However, NAND flash memory devices are slower on read when compared to NOR flash memory devices. NAND flash memory devices read faster than they write, quickly transferring whole pages of data. Less expensive than NOR flash memory devices at high densities, NAND technology offers higher capacity for the same-size silicon.

NOR-type memory arrays are widely used. One challenge associated with NOR-type memory array is the background leakage issue. In the read operation of the NOR-type memory array, only one word line is activated, and memory cells corresponding to the activated word line are accessed or selected. Memory cells corresponding to other word lines are unselected. However, there may be a leakage current in each unselected memory cell. The leakage current may cause read operation failure.

Two approaches have been used to address the background leakage issue of NOR-type memory arrays. The first approach is raising the threshold voltage (Vt) of the field-effect transistors (FETs, sometimes also referred to as "transistors") in NOR-type memory arrays. The threshold voltage of a transistor is the minimum gate-to-source voltage $V_{GS}$ that is needed to create a conducting path between the source and drain terminals. The threshold voltage can be raised by, for example, engineering the dopant concentration of the channel region and the source/drain region of the transistor. However, the increased threshold voltage results in a smaller drain current $I_D$ (sometimes also referred to as a "drain-source current IDs"), which may be unsatisfactory in many applications.

The second approach is applying a negative gate bias voltage ($V_G$) to the gate of the transistor in each unselected memory cell. However, applying a negative gate bias voltage requires additional charge pumps or power sources, which increases the chip area and the overall cost.

In accordance with some aspects of the disclosure, a memory cell array is provided. The bias voltages applied to all word lines (including one activated word line and multiple inactivated word lines in a read operation) and all source lines are increased by the same increment ($\Delta V$) such that the bias voltage applied to the inactivated word lines is raised to zero. Accordingly, the negative bias voltage ($-\Delta V$) is avoided. Since the bias voltages applied to all word lines and all source lines are increased by the same increment ($\Delta V$), the gate-to-source voltages $V_{GS}$ for all transistors are unchanged, and the functioning of all transistors remains the same.

In addition, a dual-gate transistor may be used in the memory cell. The dual-gate transistor includes a second gate structure such that both the first gate structure and the second gate structure are used for controlling the inversion of the channel layer. As a result, the threshold voltage can be increased further in addition to the increase due to the increased source bias voltage. Therefore, the leakage current can be further suppressed. Details of various aspects of the disclosure will be described below with reference to FIGS. 1-9.

Example NOR-Type Memory Cell Array with Increased Source Bias Voltage

FIG. 1 is a diagram illustrating an example memory device system 100 in accordance with some embodiments. In the example shown in FIG. 1, the memory device system 100 includes, among other components, a memory cell array 102, a word-line decoder 110, a bit-line decoder 112, a source-line decoder 114, a sensing circuitry 116, a bias generator 118, and a control logic 120. The memory cell array 102 includes multiple memory cells $190_{i,j}$ and the multiple memory cells $190_{i,j}$ are arranged in multiple rows and multiple columns. Here, i is the row number, whereas j is the column number.

In the example shown in FIG. 1, the memory cell $190_{i,j}$ is operably coupled to the word line $WL_i$, the source line $SL_j$, and the bit line $BL_j$. In some embodiments, the memory cell $190_{i,j}$ may have a one-transistor configuration (i.e., a "1T configuration"). The transistor is used as a storage element that stores information (e.g., a "logic 0" or a "logic 1"). In other embodiments, the memory cell $190_{i,j}$ may have a one-transistor-one-resistor configuration (i.e., a "1T1R configuration"). In other words, there are a transistor and a resistor connected in series in each memory cell $190_{i,j}$. The transistor is used as an access element, whereas the resistor is used as a storage element that stores information (e.g., a "logic 0" or a "logic 1").

Both the 1T configuration and the 1T1R configuration can be applied to NOR-type memory devices that include NOR-type memory arrays. The 1T configuration may be applied to, for example, NOR flash memory devices and FeRAM devices. The 1T1R configuration may be applied to, for example, MRAM devices, RRAM devices, and PCRAM devices.

Each storage element of each memory cell $190_{i,j}$ has a resistance state that is switchable between a low resistance state (LRS) and a high resistance state (HRS). The resistance states are indicative of a data value (e.g., a "logic 1" or "logic 0") stored within the storage element. As such, one bit of information can be stored in the memory cell $190_{i,j}$.

The memory cell array 102 is coupled to support circuitry that is configured to read data from and/or write data to the memory cells $190_{i,j}$. In some embodiments, the support circuitry includes the word-line decoder 110, the bit-line decoder 112, the source-line decoder 114, and the sensing circuitry 116. The word-line decoder 110 is configured to selectively apply a signal (e.g., a current and/or bias voltage) to one of the word lines $WL_i$ based upon a first address $ADDR_1$; the bit-line decoder 112 is configured to selectively apply a signal to one of the bit lines $BL_j$ based upon a second address $ADDR_2$; the source-line decoder 114 is configured to selectively apply a signal to one of the source lines $SL_j$ based upon a third address $ADDR_3$. In the illustrated example shown in FIG. 1, the second address $ADDR_2$ and the third address $ADDR_3$ is the same.

By selectively applying signals to the word lines $WL_i$, the bit line pair $BL_j$, and the source lines $SL_j$, the support circuitry is able to perform write (sometimes also referred to as "set" or "programming"), erase (sometimes also referred to as "reset"), and read operations on selected one(s) of the memory cells $190_{i,j}$. The sensing circuitry 116 is configured to sense this signal on the bit line $BL_j$ and to determine the data state of the selected memory cell $190_{i,j}$ based on the signal (e.g., by comparing a received voltage to a reference voltage).

The bias generator 118 is configured to provide various bias voltages for different components of the memory device system 100. In the illustrated example, the bias generator 118 generates bias voltages for the word line $WL_i$, the bit line $BL_j$, and the source line $SL_j$. The control logic 120 is configured to control the functioning of the memory device system 100.

It should be understood that the example shown in FIG. 1 is exemplary rather than limiting, and the memory device system 100 may include other components and functions in other embodiments.

Figure 2:
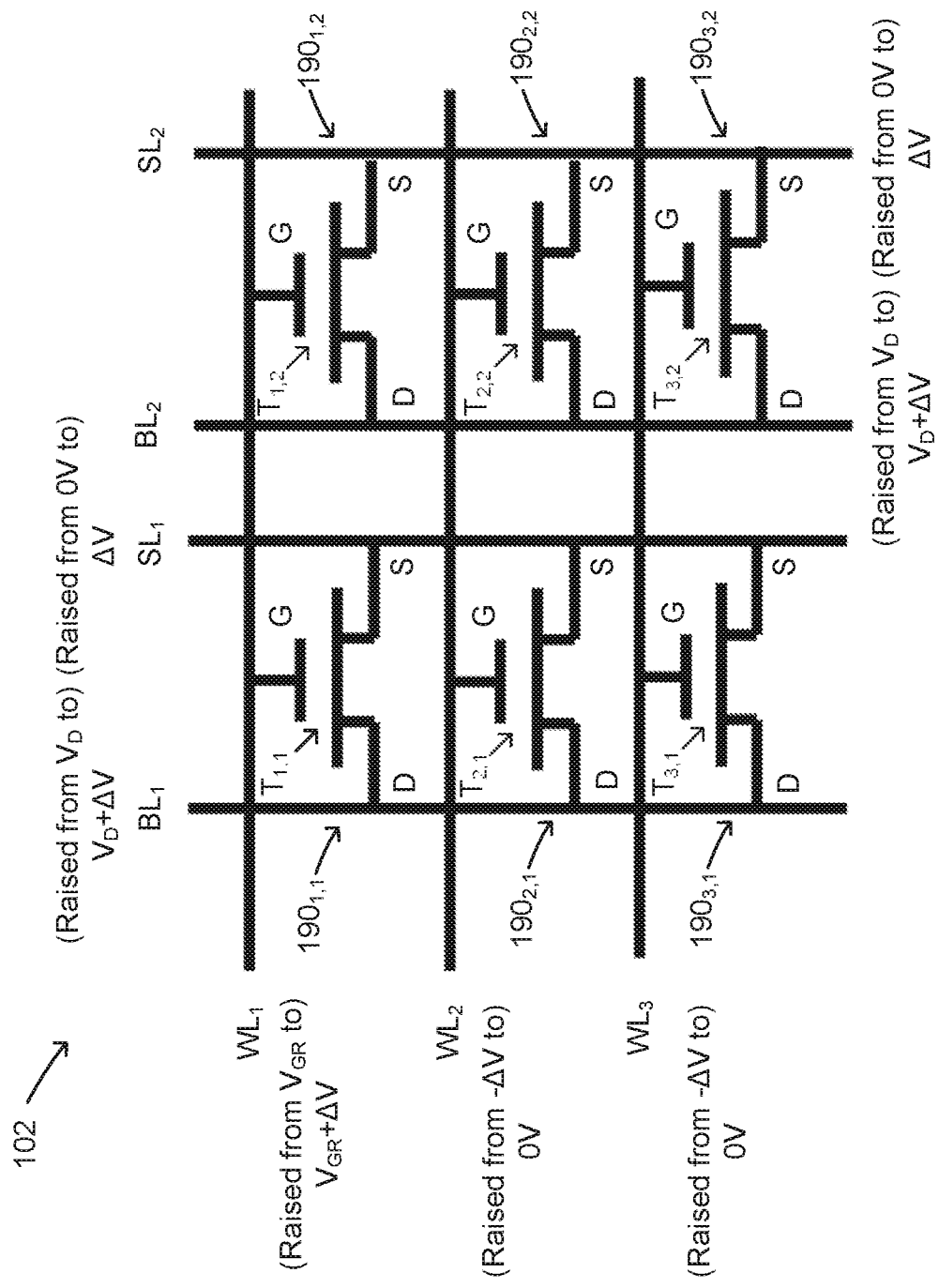
FIG. 2 is a diagram illustrating an example memory cell array with a one-transistor (1T) configuration in accordance with some embodiments.
Figure 3:
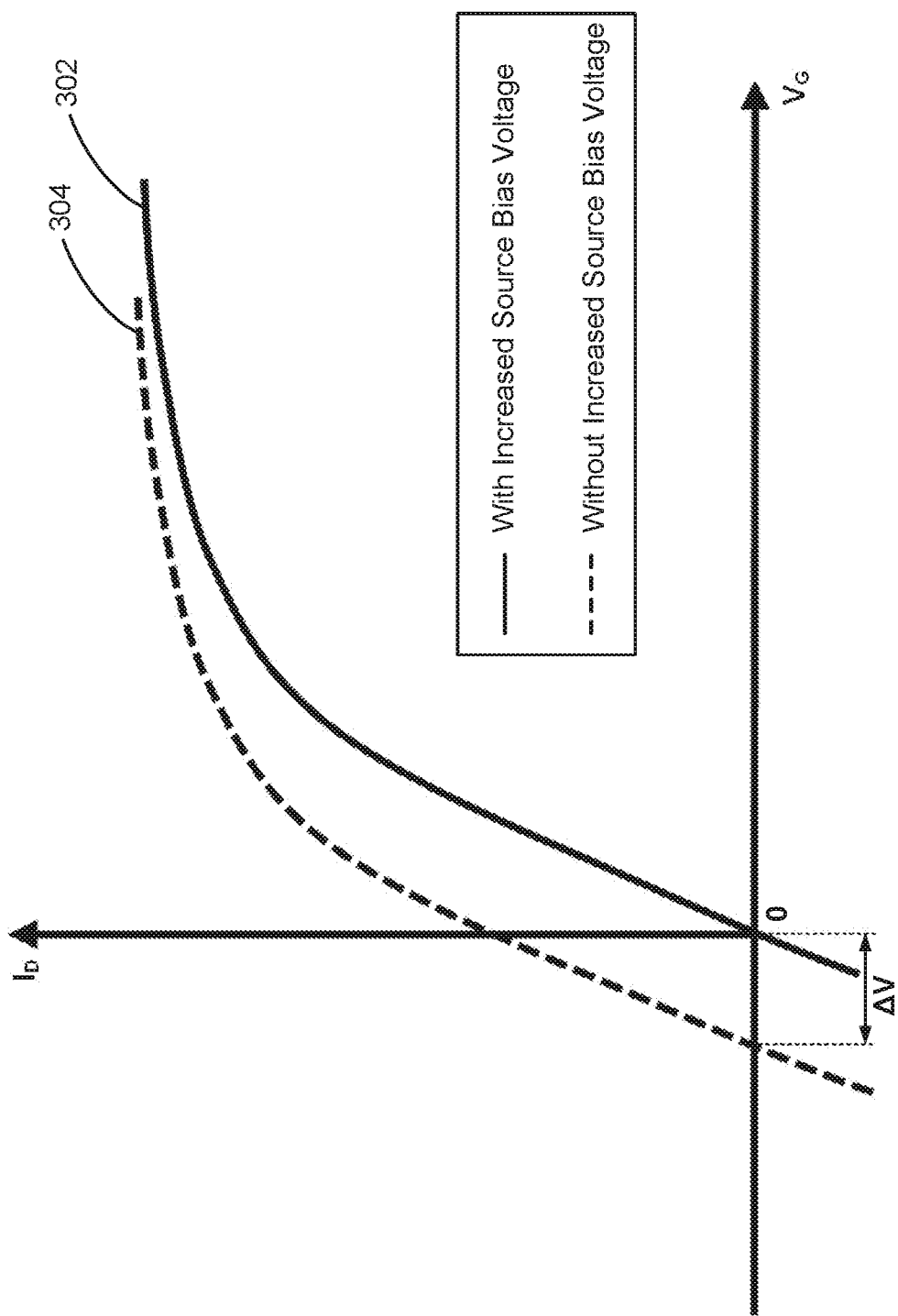
FIG. 3 is a diagram illustrating an example $I_D$-$V_G$ curve of one transistor in an unselected memory cell of the memory cell array 102 shown in FIG. 2 in accordance with some embodiments.

FIG. 2 is a diagram illustrating an example memory cell array 102 with a 1T configuration in accordance with some embodiments. FIG. 3 is a diagram illustrating an example $I_D$-$V_G$ curve of one transistor in an unselected memory cell of the memory cell array 102 shown in FIG. 2 in accordance with some embodiments. In the example shown in FIG. 2, the memory cell array 102 is a NOR flash memory cell array. However, it should be understood that the aspects discussed in the present disclosure can be applied to other types of memory cell arrays, such as a FeRAM memory cell array.

In the example shown in FIG. 2, the memory cell array 102 includes six cells $190_{1,1}$, $190_{1,2}$, $190_{2,1}$, $190_{2,2}$, $190_{3,1}$, and $190_{3,2}$ arranged in three rows and two columns. Each cell $190_{i,j}$ has a transistor $T_{i,j}$ as the storage element. The first world line $WL_1$ is activated, whereas the second word line $WL_2$ and the third word line $WL_3$ are not activated. As such, the memory cells $190_{1,1}$ and $190_{1,2}$ are accessed or selected; the memory cells $190_{2,1}$, $190_{2,2}$, $190_{3,1}$, and $190_{3,2}$ are not accessed or selected.

In the example shown in FIG. 2, the first bit line $BL_1$ and the first source line SU are activated; the second bit line $BL_2$ and the second source line $SL_2$ are activated. As such, the data stored in the memory cell $190_{1,1}$ is read on the first bit line $BL_1$; the data stored in the memory cell $190_{1,2}$ is read on the second bit line $BL_2$.

Conventionally, as to word lines, the bias voltage applied to the first word line $WL_1$ (i.e., the gate bias voltage $V_G$ of the transistors $T_{1,1}$ and $T_{1,2}$) is a read voltage $V_{GR}$; the bias voltage applied to both the second word line $WL_2$ and the third word line $WL_3$ (i.e., the gate bias voltage $V_G$ of the transistors $T_{2,1}$, $T_{2,2}$, $T_{3,1}$, and $T_{3,2}$) is a negative bias voltage ($-\Delta V$). Conventionally, as to source lines and bit lines, the bias voltage applied to both the first source line $SL_1$ and the second source line $SL_2$ (i.e., the source bias voltage $V_S$ of the transistors $T_{1,1}$, $T_{1,2}$, $T_{2,1}$, $T_{2,2}$, $T_{3,1}$, and $T_{3,2}$) is zero; the bias voltage applied to both the first bit line $BL_1$ and the second bit line $BL_2$ (i.e., the drain bias voltage $V_D$ of the transistors $T_{1,1}$, $T_{1,2}$, $T_{2,1}$, $T_{2,2}$, $T_{3,1}$, and $T_{3,2}$) is $V_D$. Therefore, the gate-to-source voltage $V_{GS}$ of the transistors $T_{1,1}$ and $T_{1,2}$ is $V_{GR}$, turning the transistors $T_{1,1}$ and $T_{1,2}$ on during the read operation; the gate-to-source voltage $V_{GS}$ of the transistors $T_{2,1}$, $T_{2,2}$, $T_{3,1}$, and $T_{3,2}$ is the negative bias voltage ($-\Delta V$), turning the transistors $T_{2,1}$, $T_{2,2}$, $T_{3,1}$, and $T_{3,2}$ off during the read operation to suppress the leakage current for the unselected memory cells 190. In one example, the negative bias voltage ($-\Delta V$) is $-0.3V$. It should be understood that other negative bias voltage values can be employed in other examples as needed, depending on factors such as technology nodes, process variations, and the like.

As mentioned above, introducing a negative bias voltage requires additional charge pumps or power sources, which increases the chip area and the overall cost. Thus, in accordance with aspects of the present disclosure, the bias voltages applied to all word lines $WL_1$, $WL_2$, and $WL_3$ and all source lines $SL_1$ and $SL_2$ are increased by the same increment ($\Delta V$) such that the bias voltage applied to both the second word line $WL_2$ and the third word line $WL_3$ (i.e., the gate bias voltage $V_G$ of the transistors $T_{2,1}$, $T_{2,2}$, $T_{3,1}$, and $T_{3,2}$) is raised to zero. In other words, the gate bias voltage $V_G$ of the transistors $T_{2,1}$, $T_{2,2}$, $T_{3,1}$, and $T_{3,2}$ in unselected memory cells 190 is raised from the negative bias voltage ($-\Delta V$) to zero. Accordingly, the negative bias voltage ($-\Delta V$) is avoided. Since the bias voltages applied to all word lines $WL_1$, $WL_2$, and $WL_3$ and all source lines $SL_1$ and $SL_2$ are increased by the same increment ($\Delta V$), the gate-to-source voltages $V_{GS}$ for all transistors are unchanged, and the functioning of all transistors remain the same. The absolute value of the negative bias voltage ($-\Delta V$) is equal to the bias voltage ($\Delta V$) applied to the source line.

In some embodiments, the bias voltage applied to the bit lines $BL_1$ and $BL_2$ is increased by the same increment ($\Delta V$) as well. Specifically, the bias voltages applied to the bit lines $BL_1$ and $BL_2$ are increased from $V_D$ to ($V_D \pm \Delta V$). As such, the drain-to-source voltage $V_{DS}$ for all transistors is unchanged as well. In other embodiments, the bias voltage applied to the bit lines $BL_1$ and $BL_2$ is unchanged (i.e., $V_D$). The drain-to-source voltage $V_{DS}$ for all transistors becomes smaller accordingly, which may change the drain current $I_D$ to some extent.

Now referring to FIG. 3, the $I_D$-$V_G$ curves 302 and 304 of one transistor (e.g., the transistor $T_{2,1}$) in an unselected memory cell (e.g., the memory cell $190_{2,1}$) of the memory cell array 102 are shown. The $I_D$-$V_G$ curve 304 corresponds to the conventional situation where the source bias voltage is not increased, while the $I_D$-$V_G$ curve 302 corresponds to the situation where the source bias voltage is increased from 0V to a positive bias voltage ($\Delta V$).

As shown in FIG. 3, without the increased source bias voltage, the bias voltage applied to both the second word line $WL_2$ and the third word line $WL_3$ (i.e., the gate bias voltage $V_G$ of the transistors $T_{2,1}$, $T_{2,2}$, $T_{3,1}$, and $T_{3,2}$) need to be a negative bias voltage ($-\Delta V$) to suppress the leakage current (i.e., to reduce the leakage current to substantially zero). In other words, the zero-crossing $V_G$ is a negative bias voltage ($-\Delta V$). In contrast, with the increased source bias voltage, the $I_D$-$V_G$ curve 302 can be regarded as the $I_D$-$V_G$ curve 304 being shifted to the right with an increment of $\Delta V$ because $V_G$ is increased by $\Delta V$ in order to maintain the same gate-to-source voltage $V_{GS}$ as $V_S$ is increased by $\Delta V$. As a result, the gate bias voltage $V_G$ to suppress the leakage current is zero. In other words, the zero-crossing $V_G$ is raised from the negative bias voltage ($-\Delta V$) to zero. Thus, no negative bias voltage is needed. By applying a positive bias voltage $\Delta V$ on the source side (i.e., the source lines $SL_1$ and $SL_2$) of the memory cell 190, the threshold voltage Vt is increased while keeping a comparable drain current $I_D$.

While six memory cells 190 arranged in three rows and two columns are shown in FIG. 2 as an example, it should be understood that the techniques disclosed in the present disclosure are generally applicable to a memory cell array 102 having n×m memory cells arranged in n rows and m columns, where n and m are integers larger than one. It should also be understood that the techniques disclosed in the present disclosure are generally applicable to other memory cell arrays with the 1T configuration.

Figure 4:
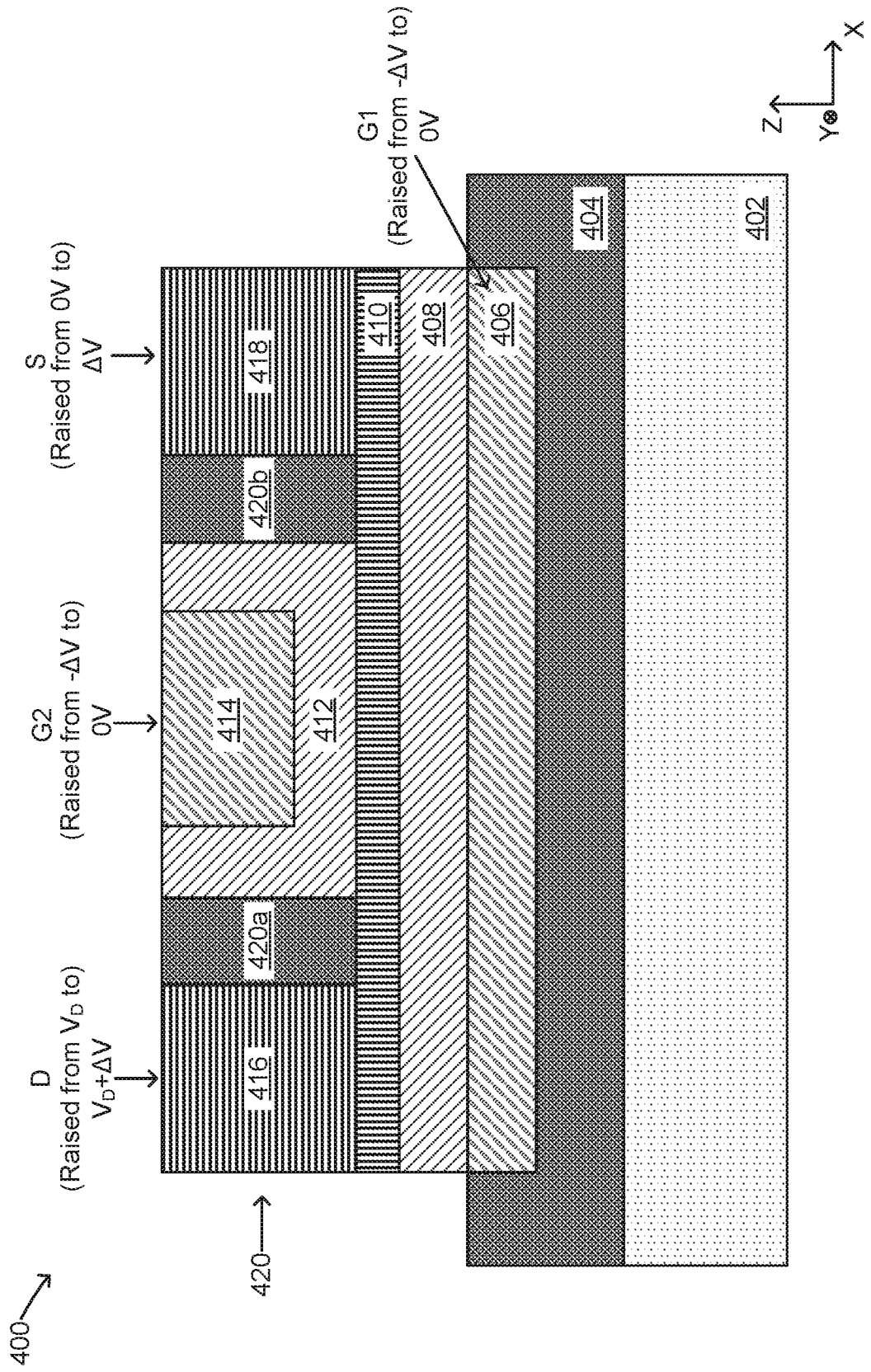
FIG. 4 is a cross-sectional diagram illustrating an example dual-gate transistor in accordance with some embodiments.

Example NOR-Type Memory Array with Increased Source Bias Voltage and Dual-Gate Transistors FIG. 4 is a cross-sectional diagram illustrating an example dual-gate transistor 400 in accordance with some embodiments. The dual-gate transistor 400 can be used as the transistors $T_{1,1}$, $T_{1,2}$, $T_{2,1}$, $T_{2,2}$, $T_{3,1}$, and $T_{3,2}$ shown in FIG. 2 as storage elements for the memory cells 190 with the 1T configuration. As will be explained below with reference to FIGS. 4 and 7, the second gate structure is introduced such that both the first gate structure and the second gate structure are used for controlling the inversion of the channel layer. As a result, the threshold voltage can be increased further in addition to the increase due to the increased source bias voltage. Therefore, the leakage current can be further suppressed.

In the example shown in FIG. 4, the dual-gate transistor 400 includes, among other components, a substrate 402, a first oxide layer 404, a first gate structure 406, a first dielectric layer 408, a channel layer 410, a drain contact 416, a source contact 418, a second dielectric layer 412, and a second gate structure 414. The channel layer 410 includes a drain region under the drain contact 416, a source region under the source contact 418, and a channel region between the drain region and the source region in a first horizontal direction (i.e., the X-direction shown in FIG. 4). The dual-gate transistor 400 may further include a second oxide layer 420 (including components such as second oxide layer spacers 420a and 420b shown in FIG. 4).

During the read operation, if the dual-gate transistor 400 is the storage element in an unselected memory cell 190 (e.g., the memory cell $190_{2,1}$ shown in FIG. 2), the bias voltage applied to the first gate structure 406 is raised from the negative bias voltage ($-\Delta V$) to zero, the bias voltage applied to the second gate structure 414 is raised from the negative bias voltage ($-\Delta V$) to zero, the bias voltage applied to the source contact 418 is raised from zero to the positive bias voltage $\Delta V$, and the bias voltage applied to the drain contact 416 is raised from $V_D$ to ($V_D+\Delta V$).

As explained above, since the bias voltages applied to the first gate structure 406, the second gate structure 414, the drain contact 416, and the source contact 418 are increased by the same increment ($\Delta V$), the gate-to-source voltages $V_{GS}$ is unchanged, and the functioning of the transistor remains the same. The negative bias voltage ($-\Delta V$) is avoided on the other hand. In other words, a higher threshold voltage $V_t$ is achieved while keeping a comparable drain current $I_D$.

The first gate structure 406 is embedded in the first oxide layer 404. In one implementation, the first gate structure 406 is formed by etching a trench in the first oxide layer 404, forming the first gate structure 406 in the trench, and performing a planarization process such as a chemical-mechanical polishing (CMP) process.

The first gate structure 406 is formed before the channel layer 410 is formed. Therefore, the fabrication of the first gate structure 406 will not have any damages to the channel region of the channel layer 410 disposed between the source contact 418 and the drain contact 416 in the X-direction. However, the control of the first gate structure 406 over the channel region may be compromised due to the drain bias voltage $V_D$ applied to the drain contact 416 and the source bias voltage $V_S$ applied to the source contact 418.

Therefore, a second gate structure 414 and a second layer 412 are introduced for better control over the channel region. The second gate structure 414 can provide control over the channel region of the channel layer 410 from the top in the vertical direction (i.e., the Z-direction shown in FIG. 4) in addition to the first gate structure 406. As a result, a higher threshold voltage Vt can be achieved.

In the example shown in FIG. 4, the drain contact 416, the source contact 418, the second gate structure 414, and the second dielectric layer 412 are all disposed in the second oxide layer 420. In some implementations, the drain contact 416, the source contact 418, the second gate structure 414, and the second dielectric layer 412 are formed in trenches etched in the second oxide layer 420, followed by a planarization process such as a CHIP process.

The drain contact 416, the source contact 418, and the second dielectric layer 412 are disposed on the channel layer 410. The second gate structure 414 is surrounded by the second dielectric layer 412. The sidewalls of the second dielectric layer 412 are separated from the drain contact 416 and the source contact 418 by the second oxide layer spacers 420a and 420b, respectively.

In some embodiments, the substrate 402 is a silicon substrate, and the first oxide layer is a silicon dioxide layer, and the second oxide layer 420 is a silicon dioxide layer. In some embodiments, the channel layer 410 includes Group IV semiconductors such as Si, SiGe, and the like. In other embodiments, the channel layer 410 includes II-V semiconductors such as GaAs, InAs, InSb, and the like. In yet other embodiments, the channel layer 410 includes other semiconductors such as indium tin oxide (ITO), indium zinc oxide (IZO), indium tungsten oxide (IWO), and the like.

In some embodiments, both the first dielectric layer 408 and the second dielectric layer 412 include one or more dielectric materials such as a high-K dielectric material (e.g., $HfO_2$, HfSiO, HfSiON, HfTaO, HfTiO, HfZrO, zirconium oxide, aluminum oxide, hafnium dioxide-alumina ($HfO_2$—$Al_2O_3$) alloy, and the like), semiconductor oxide, semiconductor nitride, semiconductor oxynitride, semiconductor carbide, amorphous carbon, tetraethylorthosilicate (TEOS), other suitable dielectric material, and/or combinations thereof. In some examples, both the first dielectric layer 408 and the second dielectric layer 412 include an oxide such as $SiO_2$, $SiAlO_x$, $HfO_2$, $ZrO_2$, and the like. In some embodiments, the first gate structure 406 and the second gate structure 414 are polysilicon gate structures. In other embodiments, the first gate structure 406 and the second gate structure 414 are metal gate structures.

It should be understood the materials mentioned in these embodiments above are not intended to be limiting, and other suitable materials may be employed in other embodiments.

Figure 7:
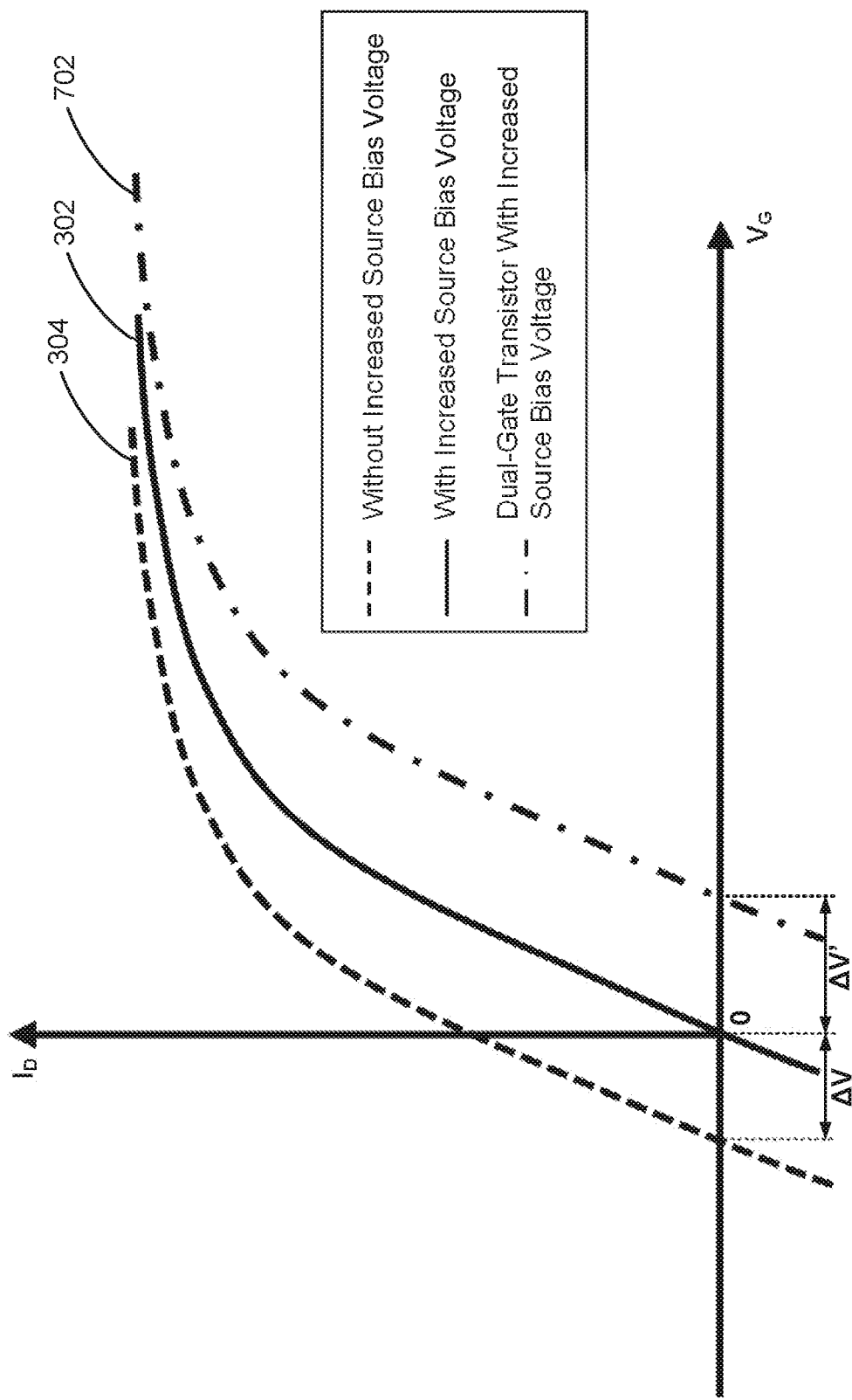
FIG. 7 is a diagram illustrating an example $I_D$-$V_G$ curve of one transistor in an unselected memory cell of the memory cell array 102 shown in FIG. 2 in accordance with some embodiments.

FIG. 7 is a diagram illustrating an example $I_D$-$V_G$ curve of one transistor in an unselected memory cell of the memory cell array 102 shown in FIG. 2 in accordance with some embodiments.

The $I_D$-$V_G$ curves 302 and 304 are identical to those shown in FIG. 3. The $I_D$-$V_G$ curve 304 corresponds to the conventional situation where the source bias voltage is not increased, while the $I_D$-$V_G$ curve 302 corresponds to the situation where the source bias voltage is increased from 0V to a positive bias voltage ($\Delta V$). In addition, the $I_D$-$V_G$ curve 702 corresponds to the situation where the source bias voltage is increased from 0V to a positive bias voltage ($\Delta V$) and the transistor in each memory cell is a dual-gate transistor shown in FIG. 4.

As explained above, with the increased source bias voltage, the $I_D$-$V_G$ curve 302 can be regarded as the $I_D$-$V_G$ curve 304 being shifted to the right with an increment of $\Delta V$ because $V_G$ is increased by $\Delta V$ in order to maintain the same gate-to-source voltage $V_{GS}$ as $V_S$ is increased by $\Delta V$. As a result, the zero-crossing $V_G$ is raised from the negative bias voltage ($-\Delta V$) to zero. By applying a positive bias voltage $\Delta V$ on the source side (e.g., the source lines $SL_1$ and $SL_2$ shown in FIG. 2) of the memory cell 190, the threshold voltage Vt is increased while keeping a comparable drain current $I_D$.

Since both the first gate structure 406 and the second gate structure 414 are used for controlling the inversion of the channel region in the channel layer 410, the threshold voltage $V_t$ can be increased further in addition to the increase due to the increased source bias voltage. As shown in FIG. 7, the $I_D$-$V_G$ curve 702 can be regarded as the $I_D$-$V_G$ curve 302 being shifted to the right with an increment of $\Delta V'$. Therefore, the leakage current can be further suppressed.

Example Method for Fabricating Dual-Gate Transistors

Figure 5:
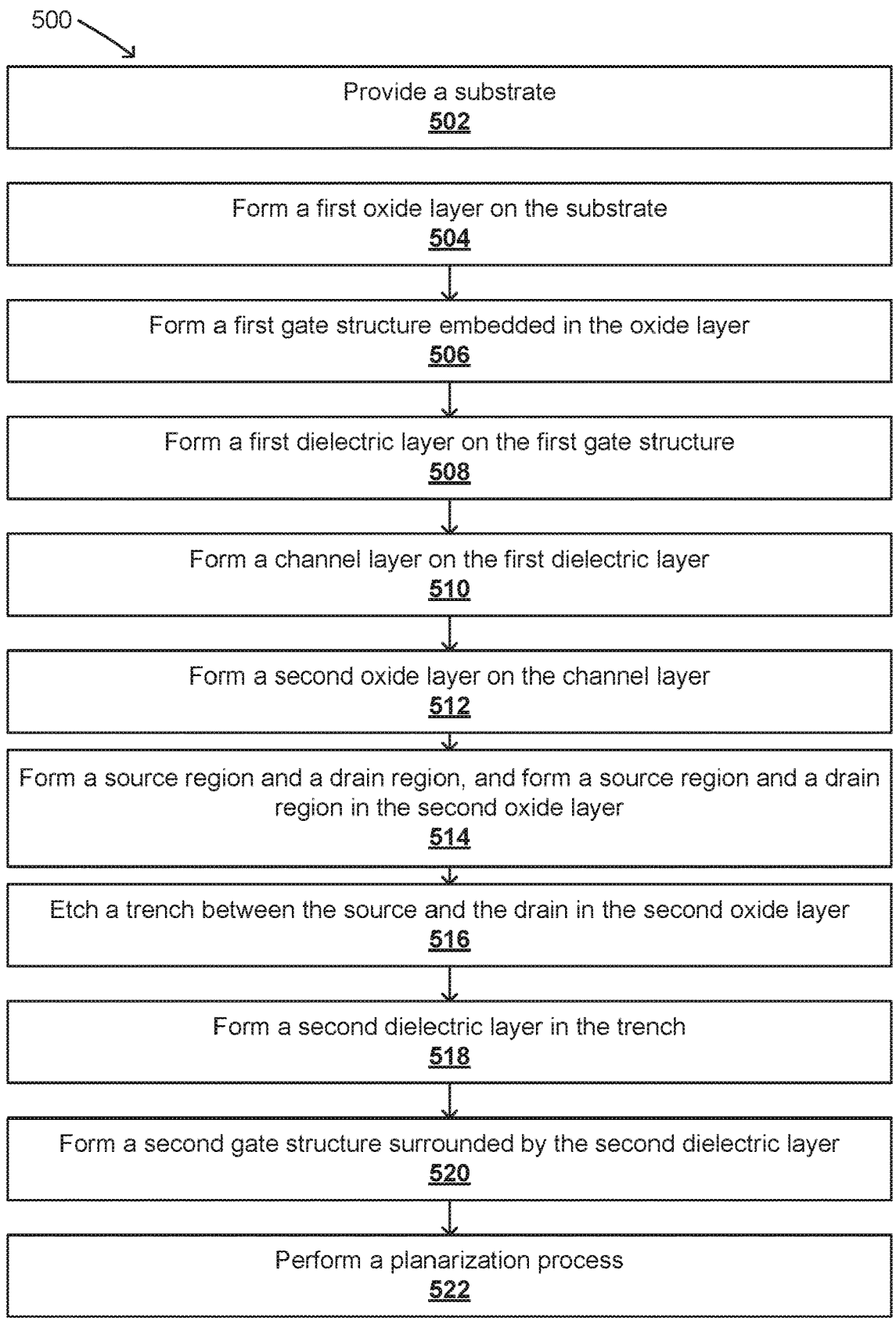
FIG. 5 is a flowchart diagram illustrating an example method for fabricating a dual-gate transistor in accordance with some embodiments.

FIG. 5 is a flowchart diagram illustrating an example method 500 for fabricating a dual-gate transistor in accordance with some embodiments. FIGS. 6A-6F are cross-sectional diagrams illustrating the dual-gate transistor at various stages in accordance with some embodiments.

In the example shown in FIG. 5, the method 500 includes operations 502, 504, 506, 508, 510, 512, 514, 516, 518, 520, and 522. Additional operations may be performed. Also, it should be understood that the sequence of the various operations discussed above with reference to FIG. 5 is provided for illustrative purposes, and as such, other embodiments may utilize different sequences. These various sequences of operations are to be included within the scope of embodiments.

At operation 502, a substrate is provided. As mentioned above, the substrate is a silicon substrate in one implementation. It should be understood that other types of substrates may be employed as well in other implementations.

At operation 504, a first oxide layer is formed on the substrate. As mentioned above, the first oxide layer is a silicon dioxide layer in one implementation. It should be understood that other types of oxides may be employed as well in other implementations. In one implementation, the first oxide layer may be thermally grown. In another implementation, the first oxide layer may be deposited using chemical vapor deposition (CVD). In yet another implementation, the first oxide layer may be deposited using atomic layer deposition (ALD).

At operation 506, a first gate structure is formed. The first gate structure is embedded in the oxide layer. In one embodiment, the first gate structure is a polysilicon gate structure. In another embodiment, the first gate structure is a metal gate structure. In one implementation, the first gate structure is formed by etching a trench in the first oxide layer, forming the first gate structure in the trench, and performing a planarization process such as a CMP process.

Figure 6A:
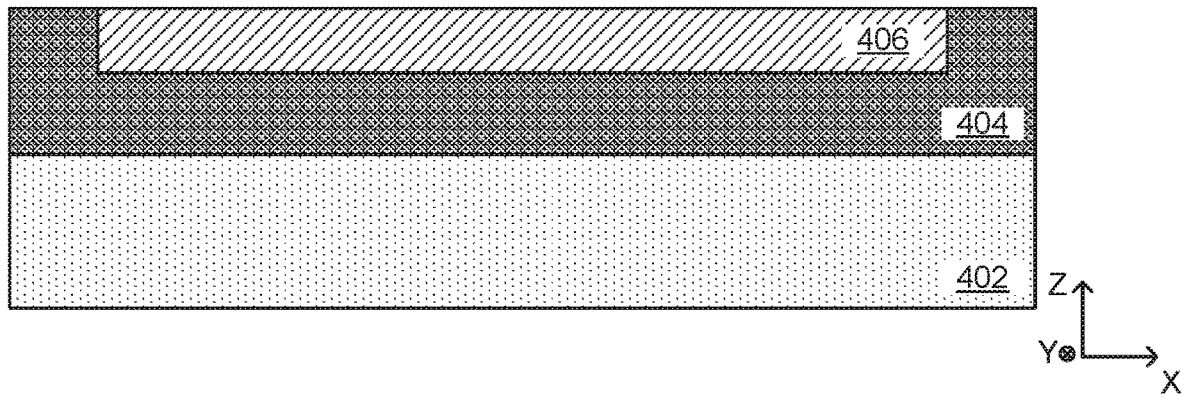
FIGS. 6A-6F are cross-sectional diagrams illustrating the dual-gate transistor at various stages in accordance with some embodiments.

As shown in FIG. 6A, after operations 502, 504, and 506, the first oxide layer 404 is disposed on the substrate 402, and the first gate structure 406 is formed in the first oxide layer 404. The first oxide layer 404 is formed in a trench in the first oxide layer 404. The first oxide layer 404 is thus embedded in the first oxide layer 404.

At operation 508, a first dielectric layer is formed on the first gate structure. In some embodiments, the first dielectric layer includes one or more dielectric materials such as a high-K dielectric material (e.g., $HfO_2$, HfSiO, HfSiON, HfTaO, HfSiO, HfZrO, zirconium oxide, aluminum oxide, hafnium dioxide-alumina ($HfO_2$—$Al_2O_3$) alloy, and the like), semiconductor oxide, semiconductor nitride, semiconductor oxynitride, semiconductor carbide, amorphous carbon, tetraethylorthosilicate (TEOS), other suitable dielectric material, and/or combinations thereof. In some examples, the first dielectric layer includes oxide such as $SiO_2$, $SiAlO_x$, $HfO_2$, $ZrO_2$, and the like. In some implementations, the first dielectric layer is formed using one of various deposition processes.

At operation 510, a channel layer is formed on the first gate dielectric layer. In some embodiments, the channel layer includes Group IV semiconductors such as Si, SiGe, and the like. In other embodiments, the channel layer includes II-V semiconductors such as GaAs, InAs, InSb, and the like. In yet other embodiments, the channel layer includes other semiconductors such as indium tin oxide (ITO), indium zinc oxide (IZO), indium tungsten oxide (IWO), and the like. It should be understood that other types of materials may be employed as well in other implementations.

At operation 512, a second oxide layer is formed on the channel layer. As mentioned above, the second oxide layer is a silicon dioxide layer in one implementation. It should be understood that other types of oxides may be employed as well in other implementations. In one implementation, the second oxide layer may be thermally grown. In another implementation, the second oxide layer may be deposited using chemical vapor deposition (CVD). In yet another implementation, the second oxide layer may be deposited using atomic layer deposition (ALD).

Figure 6B:
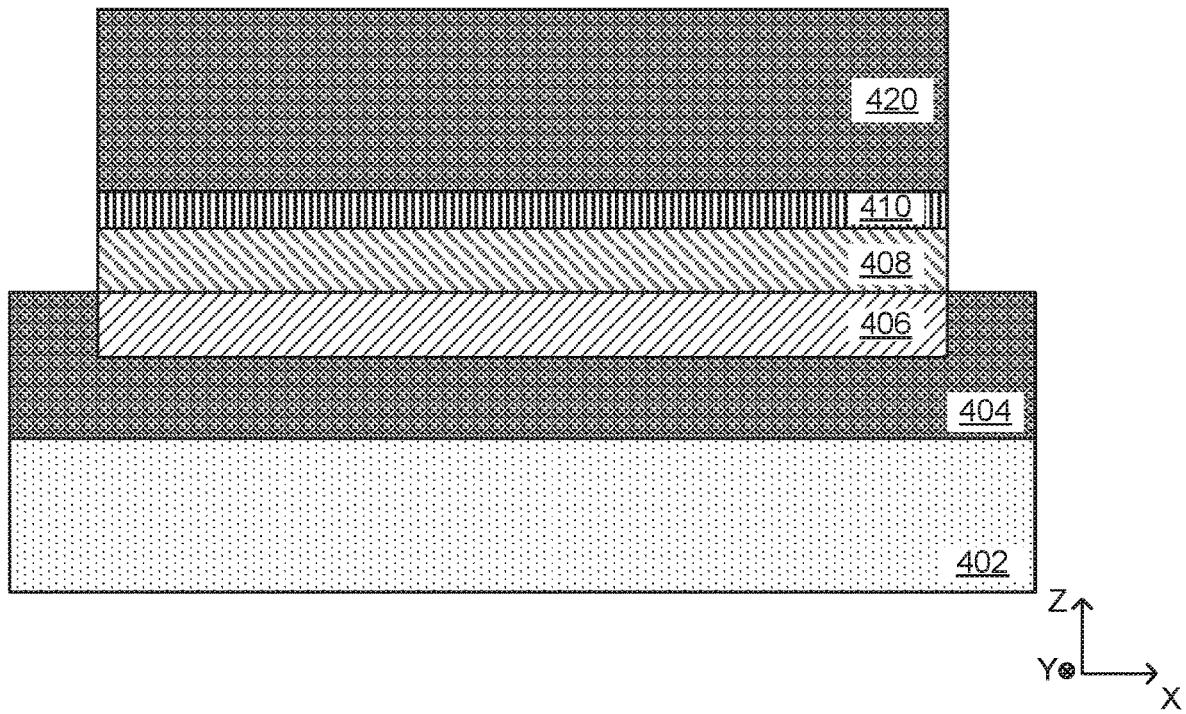

As shown in FIG. 6B, after operations 508, 510, and 512, the first dielectric layer 408 is disposed on the gate structure 406, the channel layer 410 is formed on the first dielectric layer 408, and the second oxide layer 420 is formed on the channel layer 410. In some implementations, the second oxide layer 420, the channel layer 410, and the first dielectric layer 408 are patterned and etched using photolithography such that the second oxide layer 420, the channel layer 410, and the first dielectric layer 408 are aligned with the first gate structure 406 in the horizontal plane (i.e., the X-Y plane shown in FIG. 6B).

At operation 514, a source region and a drain region are formed, and a source contact and a drain contact are formed in the second oxide layer. In one implementation, the source region and the drain region are formed by patterning and etching the second oxide layer to expose certain areas of the channel layer, doping the exposed areas of the channel layer to form the source region and the drain region. The channel layer may be doped using ion implantation, diffusion, or other suitable doping processes. In one embodiment, the source region is doped using an n-type dopant, and the drain region is doped using a p-type dopant. In another embodiment, the source region is doped using a p-type dopant, and the drain region is doped using an n-type dopant. A drain contact is formed in the second oxide layer and on the drain region; a source contact is formed in the second oxide layer and on the source region.

Figure 6C:
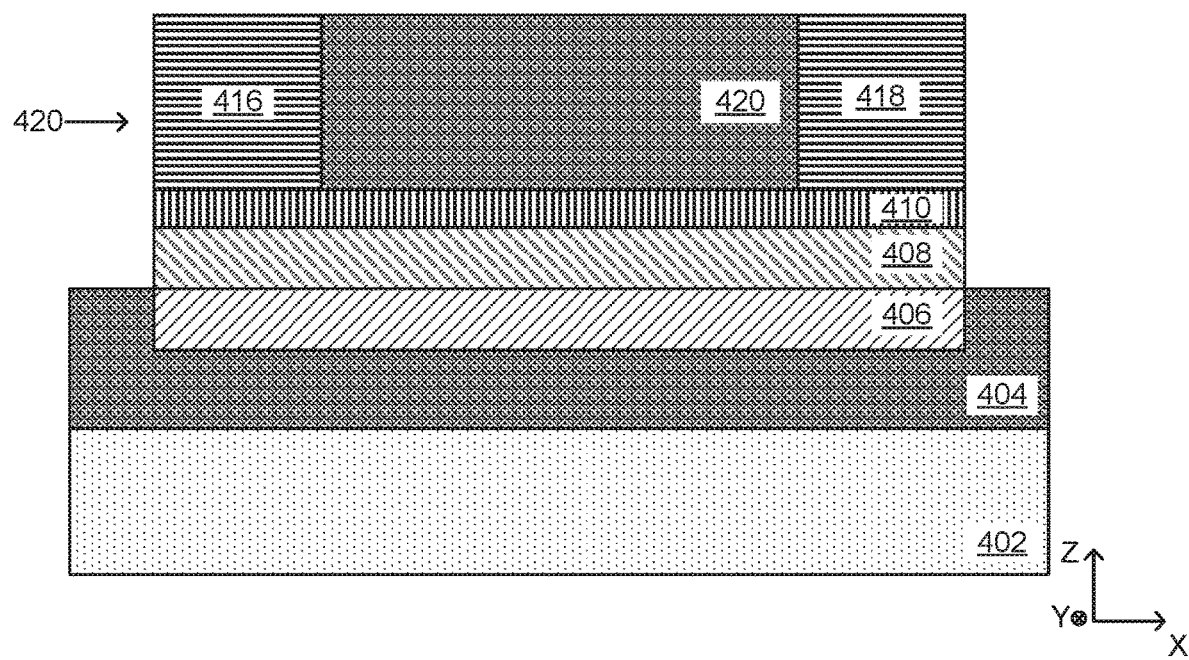

As shown in FIG. 6C, the drain region and the source region are formed by doping the exposed areas of the channel layer 410. The drain contact 416 is disposed in the second oxide layer 420 and on the drain region; the source contact 418 is disposed in the second oxide layer 420 and on the source region.

At operation 516, a trench is etched in the second oxide layer. In one implementation, the trench is formed by patterning and etching the second oxide layer. After the exposed portion of the second oxide layer is etched, the trench is formed in the second oxide layer.

Figure 6D:
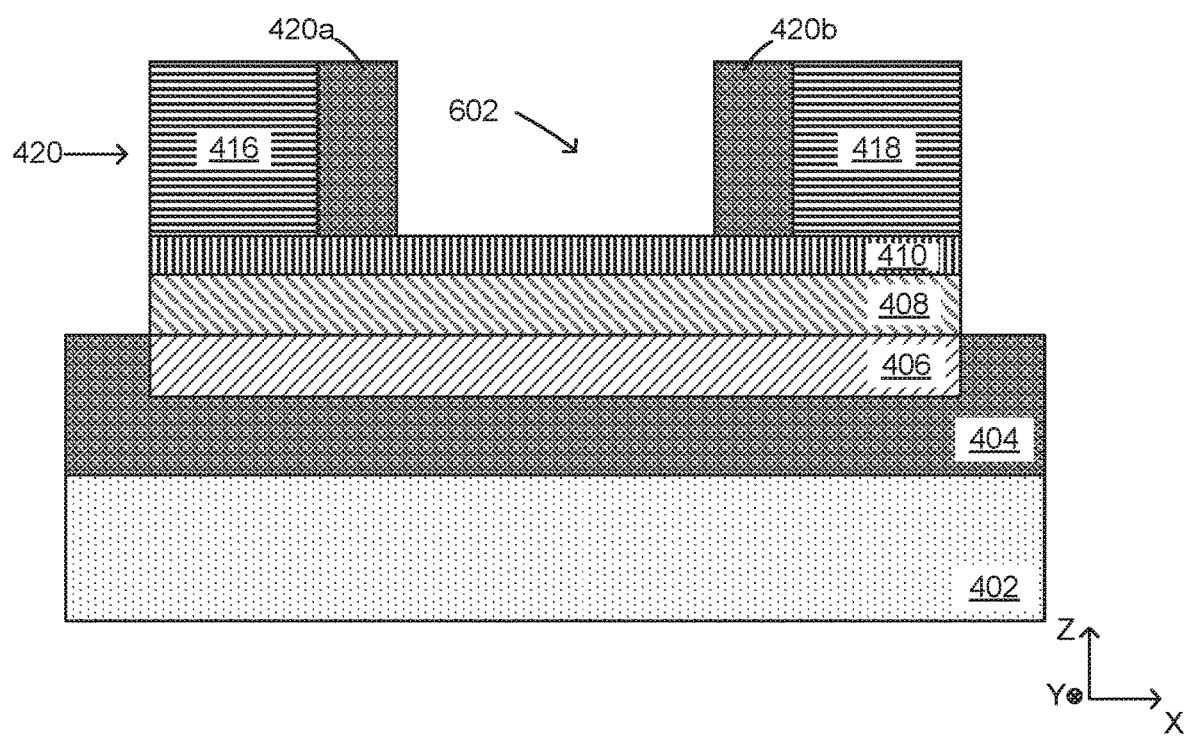

As shown in FIG. 6D, a trench 602 is formed in the second oxide layer 420. The trench is between the drain contact 416 and the source contact 418 in the X-direction. The oxide layer spacers 420a and 420b at two sides of the trench 602, respectively. The bottom of the trench 602 reaches the channel layer 410 in the vertical direction (i.e., the Z-direction).

Figure 6E:
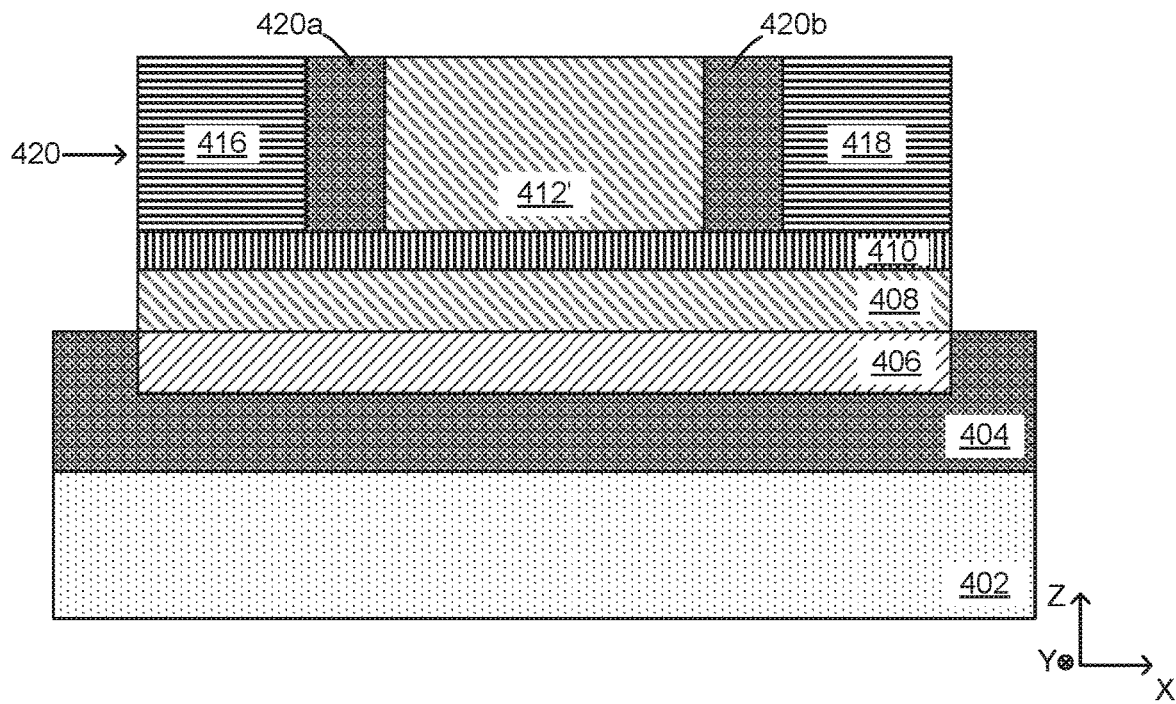

At operation 518, a second dielectric layer is formed in the trench. In some embodiments, the second dielectric layer includes one or more dielectric materials such as a high-κdielectric material (e.g., $HfO_2$, HfSiO, HfSiON, HfTaO, HfTiO, HfZrO, zirconium oxide, aluminum oxide, hafnium dioxide-alumina ($HfO_2$—$Al_2O_3$) alloy, and the like), semiconductor oxide, semiconductor nitride, semiconductor oxynitride, semiconductor carbide, amorphous carbon, tetraethylorthosilicate (TEOS), other suitable dielectric material, and/or combinations thereof. In some examples, the second dielectric layer includes oxide such as $SiO_2$, $SiAlO_x$, $HfO_2$, $ZrO_2$, and the like. In some implementations, the second dielectric layer is formed using one of various deposition processes. As shown in FIG. 6E, the second dielectric layer 412' is formed in the trench 602.

Figure 6F:
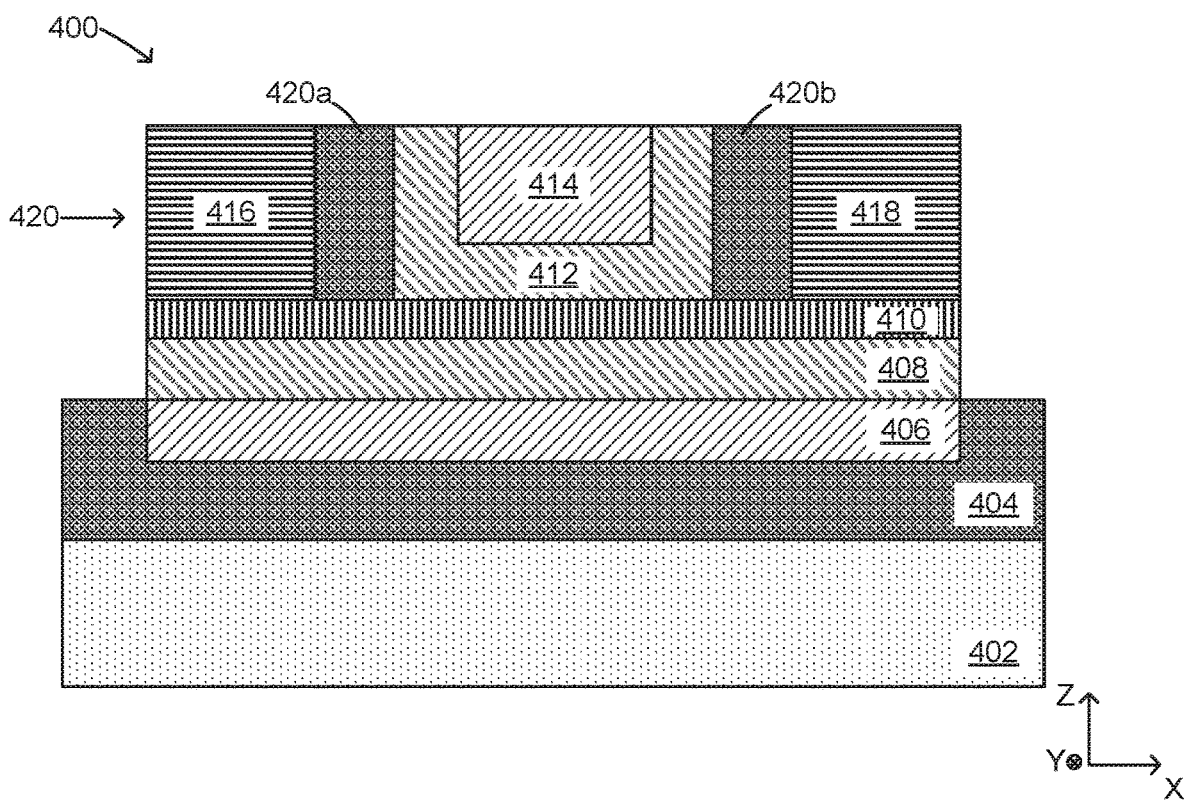

At operation 520, a second gate structure is formed. The second gate structure is surrounded by the second dielectric layer. In one embodiment, the second gate structure is a polysilicon gate structure. In another embodiment, the second gate structure is a metal gate structure. In one implementation, the second gate structure is formed by etching a trench in the second oxide layer, forming the second gate structure in the trench. As shown in FIG. 6F, the second dielectric layer 412 is formed in the trench formed in the second dielectric layer 412' that is shown in FIG. 6E.

In another implementation, the second dielectric layer 412 is conformally formed in the trench 602, and the second gate structure is formed in the remaining portion of the trench 602.

At operation 522, a planarization process is performed. In one implementation, the planarization process is a CMP process. As shown in FIG. 6F, the top surface of the dual-gate transistor 400 is planarized, and the excess portion of the second dielectric layer 412 and the excess portion of the second gate structure 414 outside the trench 602 are removed.

It should be understood that the method 500 shown in FIG. 5 is one way to fabricate the dual-gate transistor 400, and one of ordinary skill in the art would recognize many variations, modifications, and alternatives.

Figure 8:
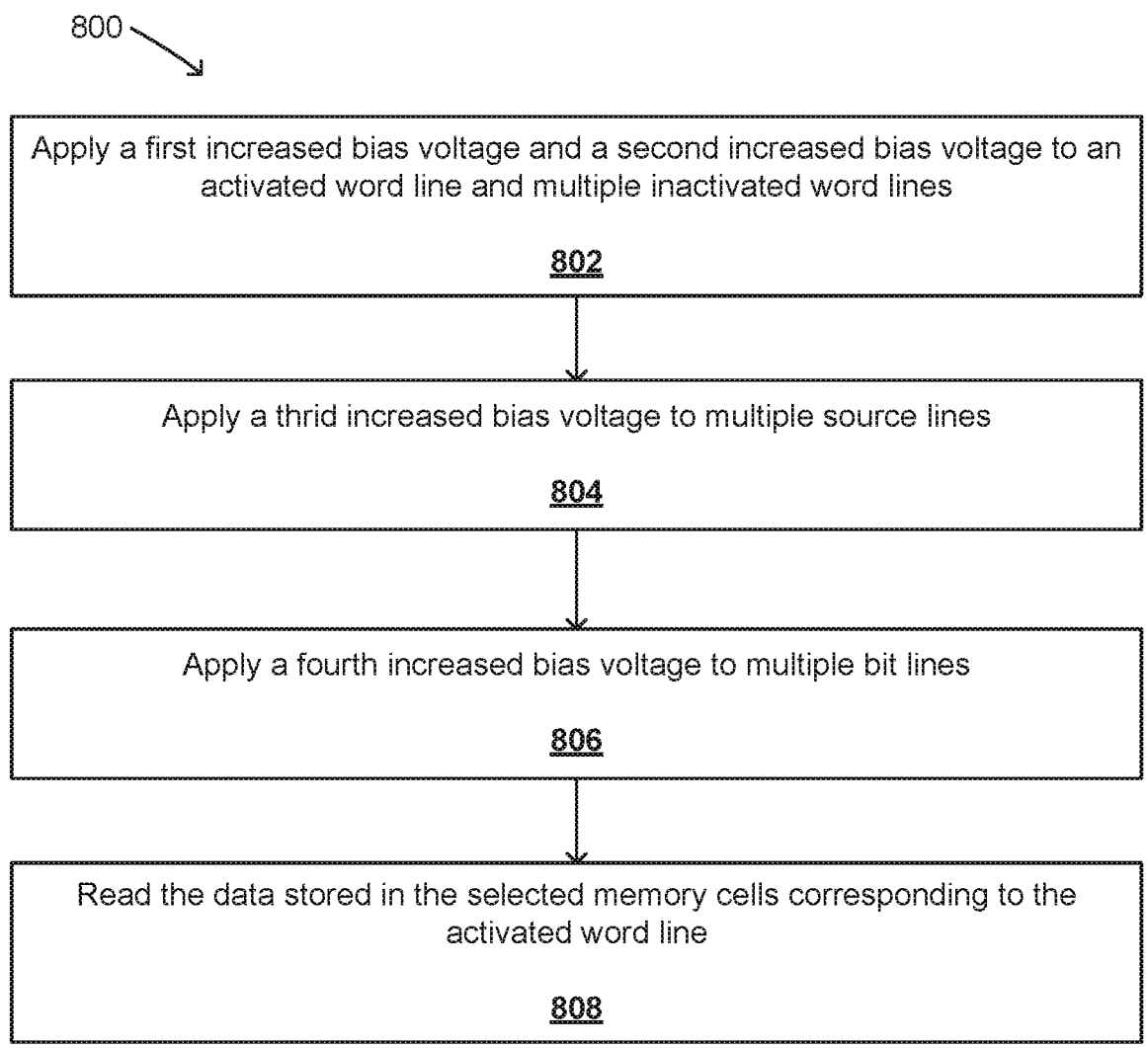
FIG. 8 is a flowchart diagram illustrating an example method for operating a memory cell array in accordance with some embodiments.

Example Method for Operating NOR-Type Memory Array with Increased Source Bias Voltage FIG. 8 is a flowchart diagram illustrating an example method 800 for operating a memory cell array in accordance with some embodiments. In some examples, the memory cell array is a NOR-type memory array (e.g., the memory cell array 102). In the example shown in FIG. 8, the method 800 includes operations 802, 804, 806, and 808. Additional operations may be performed. Also, it should be understood that the sequence of the various operations discussed above with reference to FIG. 8 is provided for illustrative purposes, and as such, other embodiments may utilize different sequences. For example, operation 806 may be performed before operation 804 in another embodiment. In yet another embodiment, operation 804 and operation 806 may be performed simultaneously. These various sequences of operations are to be included within the scope of embodiments.

At operation 802, a first increased bias voltage (e.g., ($V_{GR}+\Delta V$) shown in FIG. 2) is applied to an activated word line (e.g., the word line $WL_1$ shown in FIG. 2), and a second increased bias voltage (e.g., 0V shown in FIG. 2) is applied to multiple inactivated word lines (e.g., the word lines $WL_2$ and $WL_3$ shown in FIG. 2). For the activated word line, the bias voltage is increased by the increment ($\Delta V$), from the read voltage $V_{GR}$ to $V_{GR}+\Delta V$. For the inactivated word lines, the bias voltage is increased by the same increment ($\Delta V$), from the negative bias voltage ($-\Delta V$) to zero. As such, no negative bias voltage is needed.

At operation 804, a third increased bias voltage (e.g., $\Delta V$ shown in FIG. 2) is applied to multiple source lines (e.g., the source lines $SL_1$ and $SL_2$ shown in FIG. 2). The bias voltage is increased by the same increment ($\Delta V$), from zero to $\Delta V$. Since the bias voltage applied to the source lines is increased by the same increment ($\Delta V$), the gate-to-source voltages $V_{GS}$ for all transistors (e.g., the transistors $T_{i,j}$ shown in FIG. 2) in the memory cell array are unchanged, and the functioning of all transistors remain the same.

At operation 806, a fourth increased bias voltage (e.g., ($V_D+\Delta V$) shown in FIG. 2) is applied to multiple bit lines (e.g., the bit lines $BL_1$ and $BL_2$ shown in FIG. 2). The bias voltage is increased by the same increment ($\Delta V$), from $V_D$ to ($V_D+\Delta V$). As mentioned above, in other embodiments, the bias voltage applied to the bit lines does not have to be increased, and it can remain unchanged or increased by an increment smaller than V.

At operation 810, the data stored in the selected memory cells (e.g., the memory cells $190_{1,1}$ and $190_{1,2}$ shown in FIG. 2) corresponding to the activated word lines (e.g., the word line $WL_1$ shown in FIG. 2) are read.

Figure 9:
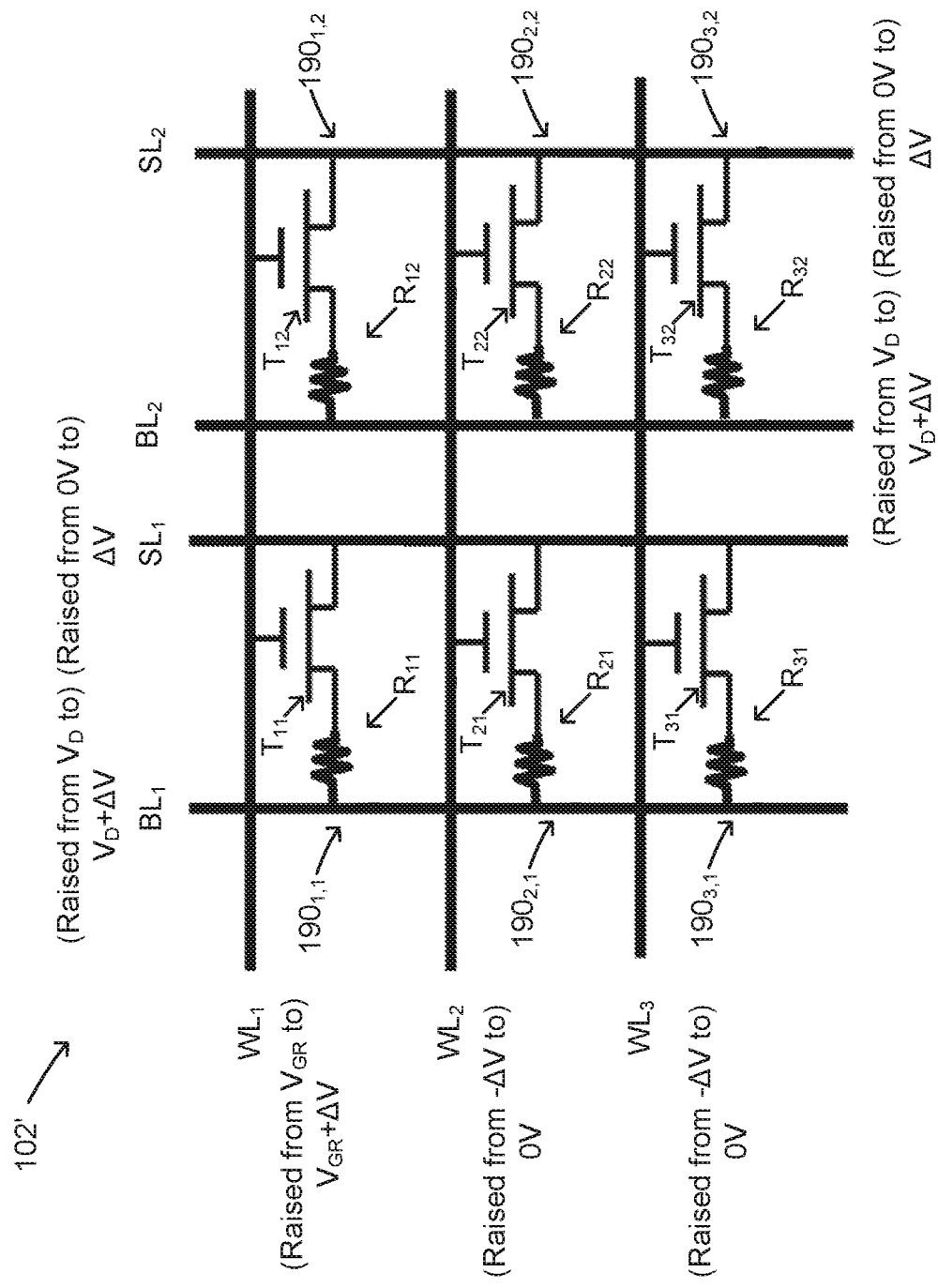
FIG. 9 is a diagram illustrating an example memory cell array with a one-transistor-one-resistor (1T1R) configuration in accordance with some embodiments.

Example NOR-Type Memory Array with Increased Source Bias Voltage with the 1T1R Configuration FIG. 9 is a diagram illustrating an example memory cell array 102' with a 1T1R configuration in accordance with some embodiments. The memory cell array 102' is identical to the memory cell array 102 shown in FIG. 2, except that a 1T1R configuration rather than a 1T configuration is used. Therefore, features that are identical to or similar to those shown in FIG. 2 will not be repeated.

In the example shown in FIG. 9, the memory cell array 102' includes six cells $190_{1,1}$, $190_{1,2}$, $190_{2,1}$, $190_{2,2}$, $190_{3,1}$, and $190_{3,2}$ arranged in three rows and two columns. Each cell $190_{i,j}$ has a transistor $T_{i,j}$ as the access element and a resistive-type memory device $R_{i,j}$ as the storage element, where i is the row number, whereas j is the column number. The transistor $T_{i,j}$ and the resistive-type memory device $R_{i,j}$ are connected in series. A first end of the resistive-type memory device $R_{i,j}$ is electrically connected to the drain of the transistor $T_{i,j}$; a second end of the resistive-type memory device $R_{i,j}$ is electrically connected to a bit line $BL_j$.

The resistive-type memory device $R_{i,j}$ has a resistance state that is switchable between a low resistance state (LRS) and a high resistance state (HRS). The resistance states are indicative of a data value (e.g., a "logic 1" or "logic 0") stored within the resistive-type memory device $R_{i,j}$. As such, one bit of information can be stored in the memory cell $190_{i,j}$. Each transistor $T_{i,j}$ can provide access to the corresponding resistive-type memory device $R_{i,j}$ when it is turned on. In one embodiment, the resistive-type memory device $R_{i,j}$ is an MRAM device. In another embodiment, the resistive-type memory device $R_{i,j}$ is an RRAM device. In yet another embodiment, the resistive-type memory device $R_{i,j}$ is a PCRAM device.

In the example shown in FIG. 9, the first world line $WL_1$ is activated, whereas the second word line $WL_2$ and the third word line $WL_3$ are not activated. As such, the memory cells $190_{1,1}$ and $190_{1,2}$ are accessed or selected; the memory cells $190_{2,1}$, $190_{2,2}$, $190_{3,1}$, and $190_{3,2}$ are not accessed or selected.

In the example shown in FIG. 0, the first bit line $BL_1$ and the first source line SU are activated; the second bit line $BL_2$ and the second source line $SL_2$ are activated. As such, the data stored in the memory cell $190_{1,1}$ is read on the first bit line $BL_1$; the data stored in the memory cell $190_{1,2}$ is read on the second bit line $BL_2$.

Similarly, the bias voltages applied to all word lines $WL_1$, $WL_2$, and $WL_3$ and all source lines $SL_1$ and $SL_2$ are increased by the same increment ($\Delta V$) such that the bias voltage applied to both the second word line $WL_2$ and the third word line $WL_3$ (i.e., the gate bias voltage $V_G$ of the transistors $T_{2,1}$, $T_{2,2}$, $T_{3,1}$, and $T_{3,2}$) is raised to zero. In other words, the gate bias voltage $V_G$ of the transistors $T_{2,1}$, $T_{2,2}$, $T_{3,1}$, and $T_{3,2}$ in unselected memory cells 190 is raised from the negative bias voltage ($-\Delta V$) to zero. Accordingly, the negative bias voltage ($-\Delta V$) is avoided. Since the bias voltages applied to all word lines $WL_1$, $WL_2$, and $WL_3$ and all source lines $SL_1$ and $SL_2$ are increased by the same increment ($\Delta V$), the gate-to-source voltages $V_{GS}$ for all transistors are unchanged, and the functioning of all transistors remain the same.

It should be understood that the transistors Ti,j shown in FIG. 9 may be implemented as dual-gate transistors (e.g., the dual-gate transistor 400 shown in FIG. 4). One of ordinary skill in the art would recognize the possibility of combining various aspects of the present disclosure.

SUMMARY

In accordance with some aspects of the disclosure, a memory cell array is provided. The memory cell array includes: a plurality of memory cells arranged in a plurality of rows and a plurality of columns; a plurality of word lines electrically connected to the plurality of rows, respectively; a plurality of source lines electrically connected to the plurality of columns, respectively; and a plurality of bit lines electrically connected to the plurality of columns, respectively. A plurality of inactivated word lines are configured to be applied a bias voltage that is zero, and the plurality of source lines are configured to be applied a positive bias voltage.

In accordance with some aspects of the disclosure, a method for operating a memory cell array is provided. The memory cell array includes: a plurality of memory cells arranged in a plurality of rows and a plurality of columns; a plurality of word lines electrically connected to the plurality of rows, respectively; a plurality of source lines electrically connected to the plurality of columns, respectively; and a plurality of bit lines electrically connected to the plurality of columns, respectively. The method includes the following steps: applying a first increased bias voltage to an activated word line; applying a second increased bias voltage to a plurality of inactivated word lines, wherein the second increased bias voltage is zero; and applying a third increased bias voltage to at least one of the plurality of source lines, wherein the third increased bias voltage is a positive bias voltage.

In accordance with some aspects of the disclosure, a NOR flash memory cell array is provided. The NOR flash memory cell array includes: a plurality of memory cells arranged in a plurality of rows and a plurality of columns, wherein each of the plurality of memory cells consists of a transistor; a plurality of word lines electrically connected to the plurality of rows, respectively; a plurality of source lines electrically connected to the plurality of columns, respectively; and a plurality of bit lines electrically connected to the plurality of columns, respectively. A plurality of inactivated word lines are configured to be applied a bias voltage that is zero, and the plurality of source lines are configured to be applied a positive bias voltage.

The foregoing outlines features of several embodiments so that one of ordinary skill in the art may better understand the aspects of the present disclosure. One of ordinary skill in the art should appreciate that they may readily use the present disclosure as a basis for designing or modifying other processes and structures for carrying out the same purposes and/or achieving the same advantages of the embodiments introduced herein. One of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell array comprising:
a plurality of memory cells arranged in a plurality of rows and a plurality of columns, wherein each of the plurality of memory cells comprises a dual-gate transistor, the dual-gate transistor comprising a silicon substrate, a channel layer over the silicon substrate, a first gate structure under the channel layer, and a second gate structure over the channel layer;
a plurality of word lines extending in a first direction and electrically connected to the plurality of rows, respectively, and wherein the first gate structure and the second gate structure of the dual-gate transistor of each of the plurality of memory cells are electrically connected to and share one of the plurality of word lines, the first gate structure and the second gate structure being equally biased;
a plurality of source lines extending in a second direction and electrically connected to the plurality of columns, respectively; and
a plurality of bit lines extending in the second direction and electrically connected to the plurality of columns, respectively; and
wherein a plurality of inactivated word lines are configured to be applied a bias voltage that is zero, and the plurality of source lines are configured to be applied a positive bias voltage.

2. The memory cell array of claim 1, wherein the bias voltage applied to the plurality of inactivated word lines is raised from a negative bias voltage to zero.

3. The memory cell array of claim 2, wherein the positive bias voltage is raised from zero to the positive bias voltage.

4. The memory cell array of claim 3, wherein an absolute value of the negative bias voltage is equal to the positive bias voltage.

5. The memory cell array of claim 1, wherein a source of the dual-gate transistor is electrically connected to one of the plurality of source lines, and a drain of the dual-gate transistor is electrically connected to one of the plurality of bit lines.

6. The memory cell array of claim 5, wherein the positive bias voltage is equal to a gate-to-source voltage of the dual-gate transistor.

7. The memory cell array of claim 6, wherein the memory cell array is a NOR flash memory cell array.

8. The memory cell array of claim 6, wherein the memory cell array is a ferroelectric random-access memory (FeRAM) memory cell array.

9. The memory cell array of claim 1, wherein each of the plurality of memory cells consists of the dual-gate transistor and a resistive-type memory device connected in series, a source of the dual-gate transistor is electrically connected to one of the plurality of source lines, and a drain of the dual-gate transistor is electrically connected to a first end of the resistive-type memory device, and a second end of the resistive-type memory device is electrically connected to one of the plurality of bit lines.

10. The memory cell array of claim 9, wherein the positive bias voltage is equal to a gate-to-source voltage of the dual-gate transistor.

11. The memory cell array of claim 1, wherein the positive bias voltage is 0.3 volts.

12. A method for operating a memory cell array,
the memory cell array comprising:
a plurality of memory cells arranged in a plurality of rows and a plurality of columns, wherein each of the plurality of memory cells comprises a dual-gate transistor, the dual-gate transistor comprising a silicon substrate, a channel layer over the silicon substrate, a first gate structure under the channel layer, and a second gate structure over the channel layer;

a plurality of word lines extending in a first direction and electrically connected to the plurality of rows, respectively, and wherein the first gate structure and the second gate structure of the dual-gate transistor of each of the plurality of memory cells are electrically connected to and share one of the plurality of word lines, the first gate structure and the second gate structure being equally biased;

a plurality of source lines extending in a second direction and electrically connected to the plurality of columns, respectively; and a plurality of bit lines extending in the second direction and electrically connected to the plurality of columns, respectively; and the method comprising:

applying a first increased bias voltage to an activated word line;

applying a second increased bias voltage to a plurality of inactivated word lines, wherein the second increased bias voltage is zero; and applying a third increased bias voltage to at least one of the plurality of source lines, wherein the third increased bias voltage is a positive bias voltage.

13. The method of claim 12, wherein the method further comprises:

applying a fourth increased bias voltage to at least one of the plurality of bit lines corresponding to the at least one of the plurality of source lines.

14. The method of claim 13, wherein the method further comprises:

reading data stored in selected memory cells corresponding to the activated word line.

15. A NOR flash memory cell array comprising:

a plurality of memory cells arranged in a plurality of rows and a plurality of columns, wherein each of the plurality of memory cells consists of a dual-gate transistor, the dual-gate transistor comprising a silicon substrate, a channel layer over the silicon substrate, a first gate structure under the channel layer, and a second gate structure over the channel layer;

a plurality of word lines extending in a first direction and electrically connected to the plurality of rows, respectively, and wherein the first gate structure and the second gate structure of the dual-gate transistor of each of the plurality of memory cells are electrically connected to and share one of the plurality of word lines, the first gate structure and the second gate structure being equally biased;

a plurality of source lines extending in a second direction and electrically connected to the plurality of columns, respectively; and a plurality of bit lines extending in the second direction and electrically connected to the plurality of columns, respectively; and wherein a plurality of inactivated word lines are configured to be applied a bias voltage that is zero, and the plurality of source lines are configured to be applied a positive bias voltage.

16. The NOR flash memory cell array of claim 15, wherein a source region of the dual-gate transistor is electrically connected to one of the plurality of source lines; and a drain region of the dual-gate transistor is electrically connected to one of the plurality of bit lines.

17. The NOR flash memory cell array of claim 16, wherein the dual-gate transistor further comprises:

a first dielectric layer between the first gate structure and the channel layer; and a second dielectric layer between the second gate structure and the channel layer.

18. The NOR flash memory cell array of claim 15, wherein the positive bias voltage is equal to a gate-to-source voltage of the dual-gate transistor.

19. The NOR flash memory cell array of claim 15, wherein the positive bias voltage is 0.3 volts.

20. The method of claim 12, wherein the positive bias voltage is equal to a gate-to-source voltage of the dual-gate transistor.

* * * * *